(12) United States Patent
Yamada

(10) Patent No.: US 7,204,865 B2
(45) Date of Patent: Apr. 17, 2007

(54) POLISHING COMPOSITION

(75) Inventor: Shuhei Yamada, Aichi (JP)

(73) Assignee: Fujimi Incorporated, Aichi (JP)

( * ) Notice: Subject to any disclaimer, the term of this patent is extended or adjusted under 35 U.S.C. 154(b) by 126 days.

(21) Appl. No.: 10/934,670

(22) Filed: Sep. 3, 2004

(65) Prior Publication Data

US 2005/0054203 A1    Mar. 10, 2005

(30) Foreign Application Priority Data

Sep. 5, 2003    (JP)    ............... 2003-313838

(51) Int. Cl.
*C09G 1/02*    (2006.01)
*C09G 1/04*    (2006.01)
*B24B 37/00*    (2006.01)
*H01L 21/311*    (2006.01)

(52) U.S. Cl. ................. 51/308; 106/3; 106/5; 438/692; 438/693

(58) Field of Classification Search .............. 51/308; 106/3, 5; 438/690–694
See application file for complete search history.

(56) References Cited

U.S. PATENT DOCUMENTS

| | | | |
|---|---|---|---|
| 3,715,842 A | 2/1973 | Tredinnick et al. | 51/281 |
| 4,169,337 A | 10/1979 | Payne | 51/283 |
| 4,462,188 A | 7/1984 | Payne | 51/283 |
| 4,588,421 A | 5/1986 | Payne | 51/308 |
| 5,352,277 A | 10/1994 | Sasaki | 106/6 |
| 2001/0003672 A1 | 6/2001 | Inoue et al. | 438/690 |
| 2002/0052064 A1 | 5/2002 | Grabbe et al. | 438/113 |
| 2002/0151252 A1 | 10/2002 | Kawase et al. | 451/36 |
| 2003/0154659 A1* | 8/2003 | Xu et al. | |
| 2004/0098924 A1 | 5/2004 | Iwasa | 51/302 |
| 2004/0127047 A1 | 7/2004 | Yamada et al. | 438/690 |

FOREIGN PATENT DOCUMENTS

| | | | |
|---|---|---|---|
| EP | 0846741 | | 6/1998 |
| JP | 10-245545 | * | 9/1998 |
| JP | 10245545 | | 9/1998 |
| JP | 2001-110760 | * | 4/2001 |
| WO | 2004/042812 | * | 5/2004 |

* cited by examiner

*Primary Examiner*—Michael A. Marcheschi
(74) *Attorney, Agent, or Firm*—Vidas, Arrett & Steinkraus PA

(57) ABSTRACT

The present invention relates to a polishing composition that can be preferably used to polish a silicon wafer. The polishing composition includes a block polyether represented by the chemical formula HO—$(EO)_a$—$(PO)_b$—$(EO)_c$—H, wherein EO represents an oxyethylene group, PO represents an oxypropylene group, each of a and c represents the polymerization degree of ethylene oxide, b represents the polymerization degree of propylene oxide, and each of a, b, and c is an integer of 1 or greater; silicon dioxide; a basic compound; at least either one of hydroxyethyl cellulose and polyvinyl alcohol; and water.

11 Claims, 2 Drawing Sheets

POLISHING COMPOSITION

BACKGROUND OF THE INVENTION

The present invention relates to a polishing composition used to polish semiconductor substrates such as a silicon wafer.

As design rules for semiconductor devices have been demanding finer patterning and processing on the substrates year by year, it has been increasingly required that a bare silicon wafer should have only a few number of flaws and high smoothness. A concave defect designated as a crystal originated particle (COP) or haze has been known as an index for evaluating surface properties of a silicon wafer. COP is generated on the surface of a silicon wafer due to crystal defects regarding a monocrystal silicon as a material for a silicon wafer, or due to scratches caused by a polishing agent. Haze is opalescent fogging that can be observed by visual observation when strong light is applied to the surface of a silicon wafer in a darkroom.

Japanese Laid-Open Patent Publication No. 2001-110760, for example, discloses a polishing composition that is improved to respond to such requirements. This polishing composition comprises a polishing material such as colloidal silica, an auxiliary polishing agent containing block polyether represented by the chemical formula $HO-(PO)_d-(EO)_e-(PO)_f-H$, and water. In the above chemical formula, PO represents an oxypropylene group, EO represents an oxyethylene group, and each of d, e, and f represents an integer of 1 or greater. The use of this polishing composition reduces haze observed on the surface of a silicon wafer after polishing to a certain extent. This is because the surface tension of the polishing composition is changed to be suitable for polishing a wafer by the action of the auxiliary polishing agent.

However, the performance of this polishing composition is not sufficient for satisfying the requirements of users regarding haze, and more improvements should be made. In addition, this polishing composition does not have a high ability to polish a silicon wafer. In other words, this polishing composition does not have an ability to rapidly polish a silicon wafer. Moreover, this polishing composition makes almost no contribution to a reduction in the number of COP observed on the surface of a silicon wafer after polishing.

SUMMARY OF THE INVENTION

Accordingly, it is an object of the present invention to provide a polishing composition that can be preferably used to polish a silicon wafer.

To achieve the foregoing and other objectives and in accordance with the purpose of the present invention, a polishing composition is provided. The polishing composition contains a block polyether represented by the chemical formula $HO-(EO)_a-(PO)_b-(EO)_c-H$, wherein EO represents an oxyethylene group, PO represents an oxypropylene group, each of a and c represents the polymerization degree of ethylene oxide, b represents the polymerization degree of propylene oxide, and each of a, b, and c is an integer of 1 or greater; silicon dioxide; a basic compound; at least either one of hydroxyethyl cellulose and polyvinyl alcohol; and water.

The present invention provides another polishing composition. The polishing composition consists of the above block polyether; silicon dioxide; a basic compound; at least either one of hydroxyethyl cellulose and polyvinyl alcohol; and water.

The present invention also provides a method for polishing a semiconductor substrate using either of the polishing compositions.

Furthermore, the present invention provides a semiconductor substrate produced by the process including polishing a half-finished product of a semiconductor substrate using either of the polishing compositions.

Other aspects and advantages of the invention will become apparent from the following description, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

One embodiment of the present invention will now be described.

The polishing composition according to the present embodiment consists of block polyether represented by chemical formula 1: HO—(EO)$_a$—(PO)$_b$—(EO)$_c$—H, silicon dioxide, a basic compound, at least either one of hydroxyethyl cellulose and polyvinyl alcohol, and water. In chemical formula 1, EO represents an oxyethylene group, PO represents an oxypropylene group, each of a and c represents the polymerization degree of ethylene oxide, b represents the polymerization degree of propylene oxide, and each of a, b, and c is an integer of 1 or greater.

The polishing composition according to the present embodiment is used to polish a semiconductor substrate such as a silicon wafer, for example. In other words, the polishing composition is used to polish a half-product of a semiconductor substrate, so as to obtain a semiconductor substrate as a polished product, for example. In general, a silicon wafer is formed by slicing a monocrystal silicon ingot. A wafer is first subjected to a lapping step to adjust the outer shape thereof. After lapping, the wafer is subjected to an etching step, so as to eliminate an affected layer generated on the surface layer thereof in the lapping step. After etching, the wafer was subjected to an edge-polishing step to polish the edge thereof. Thereafter, it was subjected to a polishing step to polish the surface thereof. Such polishing step may be divided into two or three steps, or may also be divided into four or more steps. The polishing composition in the present embodiment is preferably used in the final polishing step among such a multiple number of steps.

When the surface of a silicon wafer is polished using a polishing composition, while supplying the polishing composition to the surface of the wafer, a polishing pad is pressed against the wafer, and at least one of the polishing pad and the wafer is allowed to slide relative to the other. During this process, the surface of the wafer is mechanically polished mainly with silicon dioxide contained in the polishing composition, and is also chemically polished mainly with a basic compound contained in the polishing composition. That is to say, polishing of a silicon wafer with a polishing composition includes mechanical polishing with silicon dioxide and chemical polishing with a basic compound. Accordingly, it is considered that the rate of polishing a silicon wafer with a polishing composition is the sum of the rate of mechanical polishing with silicon dioxide and the rate of chemically polishing with a basic compound.

Figure 1:
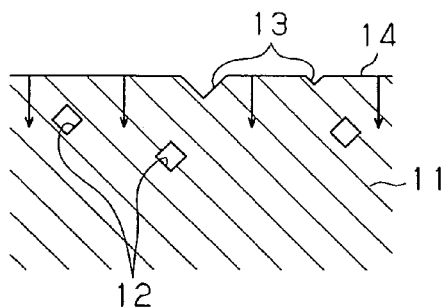
FIGS. 1(a) and 1(c) are sectional views each showing the surface portion of a silicon wafer before polishing.
FIG. 1(b) is a sectional view showing the surface portion of a silicon wafer after mechanical polishing.
FIG. 1(d) is a sectional view showing the surface portion of a silicon wafer after chemical polishing.
Figure 1:
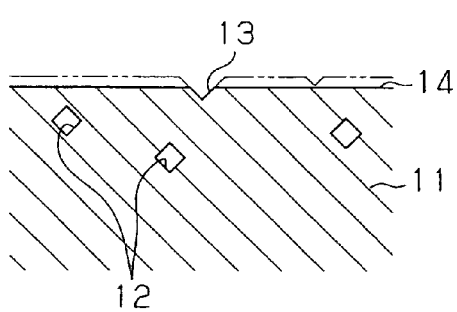
Figure 1:
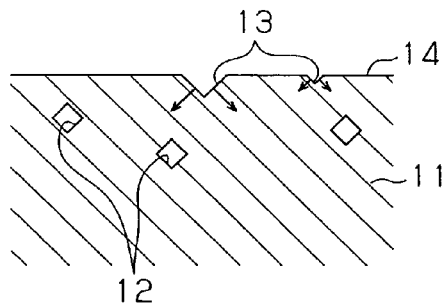
Figure 1:
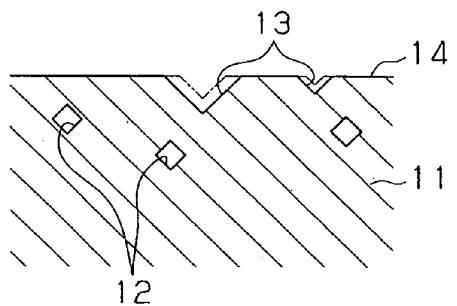

FIGS. 1(a) and 1(c) are sectional views each showing the surface portion of a silicon wafer before it is subjected to a polishing step. As shown in the figures, a silicon wafer 11 before polishing has therein multiple voids 12 caused by crystal defects of a monocrystal silicon, and it also has multiple COPs 13 on the surface 14 thereof.

When a polishing pad is pressed against a silicon wafer, the polishing pad mainly comes into contact with the wafer surface 14 wherein a COP 13 does not exist. Thus, the wafer surface 14 wherein a COP 13 does not exist is polished in the direction of a wafer thickness (the direction indicated with an arrow in FIG. 1(a)) by the mechanical polishing action of silicon dioxide. As shown in FIG. 1(b), the COPs 13 decrease as the wafer surface 14 is mechanically polished, and when the wafer surface 14 is polished up to the depth of a COP 13 or more, the COP 13 disappears. Accordingly, mechanical polishing with silicon dioxide causes a decrease in the size of a COP 13 as well as a reduction in the number of COPs 13.

On the other hand, chemical polishing with a basic compound causes an increase in the size of a COP 13. A polishing composition supplied to the wafer surface 14 for polishing is penetrated into the COP 13. Thereafter, as shown in FIG. 1(c), a basic compound contained in the polishing composition chemically polishes the inside of the COP 13 such that the size of the COP 13 is increased. That is, as shown in FIG. 1(d), the COP 13 increases as the wafer surface 14 is chemically polished.

The aforementioned polyether represented by chemical formula 1 contributes to the improvement of COPs and haze that are observed on the surface of a wafer after the wafer has been polished with a polishing composition. It is considered that the action of polyether is provided by oxyethylene groups and oxypropylene groups that are contained in the polyether. Among others, the oxyethylene group has a strong action to reduce the level of haze. The oxyethylene group reduces the resistance generated between silicon dioxide and the wafer surface during mechanical polishing with the silicon dioxide, in the presence of at least one selected from the group consisting of hydroxyethyl cellulose and polyvinyl alcohol. As a result, it is considered that the formation of fine unevenness on the wafer surface is suppressed. That is to say, oxyethylene groups contained in polyether moderately suppress mechanical polishing with silicon dioxide. Accordingly, when the action of the oxyethylene groups are strong, polishing of a silicon wafer with a polishing composition is composed almost exclusively of chemical polishing.

On the other hand, oxypropylene groups contained in polyether have a relatively strong action to suppress mechanical polishing with silicon dioxide and chemical polishing with a basic compound, as well as having an action to reduce the level of haze. The degree of mechanical polishing suppressed by the oxypropylene groups is greater than the degree of mechanical polishing suppressed by the oxyethylene groups. Accordingly, the oxypropylene groups suppress polishing of a silicon wafer with a polishing composition more strongly than the oxyethylene groups do. In addition, the degree of chemical polishing suppressed by the oxypropylene groups is greater than the degree of mechanical polishing suppressed by the same groups. Thus, when the action of the oxypropylene groups is strong, polishing of a silicon wafer with a polishing composition tends to be composed almost exclusively of mechanical polishing. Accordingly, COPs observed on the surface of a silicon wafer after polishing are improved.

Table 1 indicated below shows the summary of the above described actions of the oxyethylene groups and the oxypropylene groups contained in polyether. The number of downward arrows in the (A) to (C) columns in Table 1 indicates the degree of decrease in a polishing rate, and a hyphen indicates no decrease in such a polishing rate. As shown in Table 1, the oxyethylene groups decrease only the rate of mechanical polishing with silicon dioxide. In contrast, the oxypropylene groups decrease not only the rate of mechanical polishing with silicon dioxide, but also the rate of chemical polishing with a basic compound. Moreover, as stated above, the oxypropylene group has an action to improve COPs and haze, whereas the oxyethylene group has an action to significantly improve haze.

TABLE 1

| | (A) level of decrease in rate of polishing with polishing composition | (B) level of decrease in rate of chemical polishing | (C) level of decrease in rate of mechanical polishing | (D) action to improve COPs | (E) action to improve haze |
|---|---|---|---|---|---|
| Oxyethylene group | ↓ | — | ↓ | None | Strong |
| Oxypropylene group | ↓↓↓↓↓ | ↓↓↓ | ↓↓ | Moderate | Weak |

Polyether represented by chemical formula 1 does not have oxypropylene groups, but has oxyethylene groups as monomeric units positioned at both ends of each molecule. Accordingly, the action of oxyethylene groups is stronger than that of oxypropylene groups in such polyether. In contrast, in the case of block polyether represented by chemical formula 2: $HO-(PO)_d-(EO)_e-(PO)_f-H$, wherein PO represents an oxypropylene group, EO represents an oxyethylene group, each of d and f represents the polymerization degree of a propylene oxide, e represents the polymerization degree of ethylene oxide, and each of d, e, and f is an integer of 1 or greater, monomeric units positioned at both ends of each molecule are not oxyethylene groups, but oxypropylene groups. Accordingly, the action of oxypropylene groups is stronger than that of oxyethylene groups in such polyether.

Since a polishing composition comprising polyether represented by chemical formula 2 instead of polyether represented by chemical formula 1 has a strong action of oxypropylene groups, it has a risk of causing a significant decrease in a polishing rate. In contrast, in the polishing composition according to the present embodiment comprising polyether represented by chemical formula 1, since the action of oxyethylene groups is stronger than that of oxypropylene groups, COPs and haze can be improved by the action of oxyethylene groups and oxypropylene groups, with no significant decrease in a polishing rate.

Incidentally, a polishing composition comprising both polyether represented by chemical formula 1 and polyether represented by chemical formula 2 has a stronger action to decrease a polishing rate than that of the polishing composition according to the present embodiment. It is considered that this is influenced by the addition of polyether represented by chemical formula 2. In addition, a polishing composition comprising polyethylene oxide with a mean molecular weight between 30,000 and 50,000,000 instead of polyether represented by chemical formula 1 does not cause a significant decrease in a polishing rate, but it does not have an action to improve COPs. This is because polyethylene oxide has no oxypropylene groups.

Figure 2:
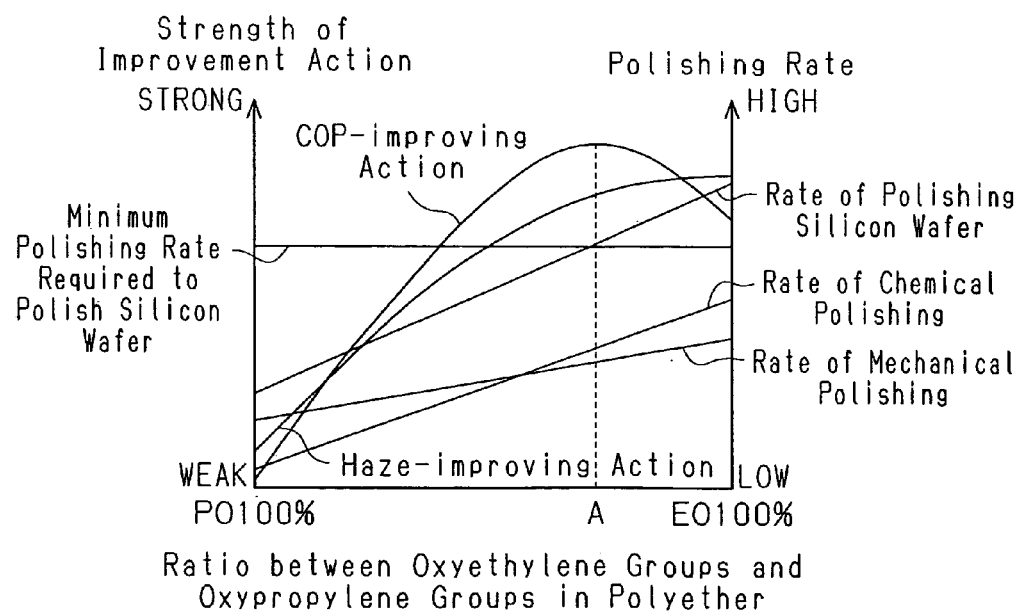
FIG. 2 is a graph showing the relationship between the ratio between oxyethylene groups and oxypropylene groups in polyether represented by chemical formula 1 and a polishing rate, and the relationship between the ratio and the strength of an improvement action.

When the ratio of oxyethylene groups is high in each molecule of polyether represented by chemical formula 1, the action of the oxyethylene groups is strong. In contrast, when the ratio of oxypropylene groups is high therein, the action of the oxypropylene groups is strong. Thus, as shown in FIG. 2, as the ratio of oxyethylene groups increases, both the rate of chemical polishing and the rate of mechanical polishing increase, and further, the rate of polishing a silicon wafer with a polishing composition also increases. Moreover, as shown in FIG. 2, as the ratio of oxyethylene groups increases, the action to improve haze also strengthens. In principle, it is predicted that the action to improve COPs increases as the ratio of oxypropylene groups increases. However, since a polishing rate decreases as the ratio of oxypropylene groups increases, when the ratio of oxypropylene groups exceeds a certain value (for example, a value A in FIG. 2), the action to improve COP decreases. The polishing rate of a polishing composition having the maximum action to improve COPs corresponds to the minimum polishing rate that is necessary for polishing a silicon wafer.

Consequently, the ratio between oxyethylene groups and oxypropylene groups in polyether represented by chemical formula 1 is preferably adjusted to a value suitable for polishing a silicon wafer. More specifically, the sum of a and c in chemical formula 1 is preferably between 2 and 1,000 inclusive, more preferably between 5 and 500 inclusive, and most preferably between 10 and 200 inclusive. In addition, the value b in chemical formula 1 is preferably between 2 and 200 inclusive, more preferably between 5 and 100 inclusive, and most preferably between 10 and 50 inclusive. When the sum of a and c in chemical formula 1 is 4 or less, there is a risk that a polishing composition does not have a high haze-improving action because the ratio of oxyethylene groups is low. Otherwise, there is a risk that a rate of polishing a silicon wafer with a polishing composition decreases because the ratio of oxypropylene groups is high. When the value b in chemical formula 1 is 1, there is a risk that a polishing composition does not have a high COP-improving action because the ratio of oxypropylene groups is low. When the sum of a and c in chemical formula 1 is 1001 or greater, or when the value b in chemical formula 1 is 201 or greater, there is a risk that the viscosity of a polishing composition excessively increases because the molecular weight of polyether is too high. A polishing composition with an excessively high viscosity is highly likely to gelatinize, thereby resulting in a decrease in a polishing ability or handlability.

The performance of the polishing composition according to the present embodiment is influenced even by the mass ratio between oxyethylene groups and oxypropylene groups contained in polyether represented by chemical formula 1. The ratio of the total mass of oxyethylene groups to the total mass of oxypropylene groups in the polyether is preferably between 30/70 and 95/5 inclusive, and more preferably between 70/30 and 90/10 inclusive. When this ratio is too low, there is a risk that a polishing composition does not have a high haze-improving action because the ratio of oxyethylene groups is low, or there is another risk that a rate of polishing a silicon wafer with a polishing composition decreases because the ratio of oxypropylene groups is high. When this ratio is too high, there is a risk that the polishing composition does not have a high COP-improving action because the ratio of oxypropylene groups is low.

The amount of polyether represented by chemical formula 1 contained in a polishing composition is preferably between 0.005% and 0.5% by mass inclusive, more preferably between 0.01% and 0.2% by mass inclusive, and most preferably between 0.02% and 0.1% by mass inclusive.

When the content of polyether is less than 0.005% by mass, there is a risk that the polishing composition does not have high COP- and haze-improving actions. When the content of polyether exceeds 0.5% by mass, there is a risk that the viscosity of the polishing composition excessively increasing.

The aforementioned silicon dioxide contained in the polishing composition plays a role in mechanically polishing a silicon wafer. Silicon dioxide may be a colloidal silica or fumed silica and is preferably a colloidal silica. A colloidal silica enables the improvement of COPs by decreasing the number of scratches generated on the surface of a silicon wafer.

When colloidal silica is used, the mean particle size $D_{SA}$ of a colloidal silica, which is obtained from a specific surface area measured by the BET method, is preferably between 5 and 300 nm inclusive, more preferably between 5 and 200 nm inclusive, and most preferably between 5 and 120 nm inclusive. Further, the mean particle size $D_{N4}$ of a colloidal silica measured by the laser scattering method is preferably between 5 and 300 nm inclusive, more preferably between 5 and 200 nm inclusive, and most preferably between 5 and 150 nm inclusive.

When fumed silica is used, the mean particle size $D_{SA}$ of a fumed silica is preferably between 10 and 300 nm inclusive, more preferably between 10 and 200 nm inclusive, and most preferably between 10 and 120 nm inclusive. Further, the mean particle size $D_{N4}$ of a fumed silica is preferably between 30 and 500 nm inclusive, more preferably between 40 and 400 nm inclusive, and most preferably between 50 and 300 nm inclusive.

Colloidal silica or fumed silica, the mean particle size $D_{SA}$ or $D_{N4}$ of which is too small, does not have high polishing ability. In contrast, when the mean particle size $D_{SA}$ or $D_{N4}$ of a colloidal silica or fumed silica contained in a polishing composition is too large, surface roughness and the number of scratches observed on a silicon wafer after polishing increase. Such an increase in the surface roughness results in deterioration of haze, and the increased number of scratches results in deterioration with respect to COPs.

Silicon dioxide generally comprises metallic impurities such as transition metals, such as iron, nickel, copper, chrome and zinc, calcium, and the hydroxides or oxides of these metals. These metal impurities may attach to the surface of a wafer or may diffuse in a wafer, so that they have a risk of affecting the electrical properties of a semiconductor device produced from the wafer. When a 20% by mass silicon dioxide aqueous solution is prepared with silicon dioxide to be used, the total amount of iron, nickel, copper, chrome, zinc, and calcium contained in the aqueous solution is preferably 300 ppm or less, more preferably 100 ppm or less, and most preferably 0.3 ppm or less. A polishing composition containing an excessive amount of metal impurities is likely to contaminate a silicon wafer with such metals.

The content of silicon dioxide in a polishing composition is preferably between 0.1% and 50% by mass inclusive, more preferably between 1% and 25% by mass inclusive, and most preferably 3% and 15% by mass inclusive. When the content of silicon dioxide is too low, there is a risk that a polishing composition does not have high polishing ability. In contrast, when the content of silicon dioxide is too high, there is a risk that the viscosity of a polishing composition excessively increasing.

The aforementioned basic compound contained in the polishing composition has a corrosive action or etching action, and plays a role in chemically polishing a silicon wafer by such action. Specific examples of a basic compound may include: inorganic alkali compounds such as potassium hydroxide, sodium hydroxide, potassium bicarbonate, potassium carbonate, sodium bicarbonate, or sodium carbonate; ammonia; ammonium salts such as tetramethylammonium hydroxide, ammonium bicarbonate, or ammonium carbonate; and amines such as methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, piperazine anhydride, piperazine hexahydrate, 1-(2-aminoethyl)piperazine, or N-methyl piperazine.

Of these, potassium hydroxide, sodium hydroxide, potassium bicarbonate, potassium carbonate, sodium bicarbonate, sodium carbonate, ammonia, tetramethylammonium hydroxide, ammonium bicarbonate, ammonium carbonate, piperazine anhydride, piperazine hexahydrate, 1-(2-aminoethyl)piperazine, and N-methyl piperazine are preferable because these compounds efficiently improve the polishing ability of a polishing composition. Further, of these, potassium hydroxide, sodium hydroxide, ammonia, tetramethylammonium hydroxide, piperazine anhydride, and piperazine hexahydrate are more preferable because these compounds contain a small amount of metal impurities, and have only a low risk of contaminating a silicon wafer with such metals. The polishing composition may comprise two or more types of basic compounds.

When a basic compound contained in the polishing composition is potassium hydroxide, sodium hydroxide, potassium bicarbonate, potassium carbonate, sodium bicarbonate, sodium carbonate, ammonia, tetramethylammonium hydroxide, ammonium bicarbonate, ammonium carbonate, methylamine, dimethylamine, trimethyl amine, ethylamine, diethylamine, triethylamine, ethylenediamine, monoethanolamine, N-(β-aminoethyl)ethanolamine, hexamethylenediamine, diethylenetriamine, or triethylenetetramine, the amount of the basic compound contained in the polishing composition is preferably between 0.05% and 10% by mass inclusive, more preferably between 0.1% and 8% by mass inclusive, and most preferably between 0.5% and 5% by mass inclusive. When a basic compound contained in the polishing composition is piperazine anhydride, 1-(2-aminoethyl)piperazine, or N-methylpiperazine, the amount of the basic compound contained in the polishing composition is preferably between 0.01% and 6% by mass inclusive, more preferably between 0.02% and 3% by mass inclusive, and most preferably between 0.2% and 1% by mass inclusive. When a basic compound contained in the polishing composition is piperazine hexahydrate, the amount of the basic compound contained in the polishing composition is preferably between 0.005% and 3% by mass inclusive, more preferably between 0.01% and 2% by mass inclusive, and most preferably between 0.1% and 0.5% by mass inclusive. When the content of a basic compound is too low, there is a risk that a polishing composition does not have high polishing ability. When the content of a basic compound is too high, the polishing composition is highly likely to gelatinize, and thus, it is uneconomical. In addition, roughness is likely to be generated on the surface of the polished wafer due to too strong etching power.

The aforementioned hydroxyethyl cellulose and polyvinyl alcohol contribute to the improvement of haze observed on the surface of a wafer after the wafer has been polished with a polishing composition. It is assumed that the reason is that hydroxyethyl cellulose and polyvinyl alcohol act as buffers during mechanical polishing with silicon dioxide, so as to suppress the formation of fine unevenness on the surface of a wafer. Moreover, hydroxyethyl cellulose and polyvinyl alcohol improve the surface wetting properties of a wafer, so as to prevent the surface of the wafer from being dried out after polishing. This action prevents foreign materials, such as silicon dioxide contained in a polishing composition, from attaching to the surface of a wafer after polishing, so that the number of stains or convex defects designated as light point defects (LPD) observed on the surface of a wafer after polishing can be reduced. Hydroxyethyl cellulose has a stronger action to improve haze than that of polyvinyl alcohol. In addition, it can significantly improve the surface wetting properties of a wafer, resulting in a significant reduction in the number of stains or LPD. Accordingly, it is preferable that a polishing composition contains hydroxyethyl cellulose rather than polyvinyl alcohol.

The mean molecular weight of hydroxyethyl cellulose to be used is preferably between 300,000 and 3,000,000 inclusive, more preferably between 600,000 and 2,000,000 inclusive, and most preferably between 900,000 and 1,500,000 inclusive. The mean molecular weight of polyvinyl alcohol to be used is preferably between 1,000 and 1,000,000 inclusive, more preferably between 5,000 and 500,000 inclusive, and most preferably between 10,000 and 300,000 inclusive. When a polishing composition contains hydroxyethyl cellulose, the content of hydroxyethyl cellulose in the polishing composition is preferably between 0.01% and 3% by mass inclusive, more preferably between 0.05% and 2% by mass inclusive, and most preferably between 0.1% and 1% by mass inclusive. When a polishing composition contains polyvinyl alcohol, the content of polyvinyl alcohol in the polishing composition is preferably between 0.002% and 4% by mass inclusive, more preferably between 0.01% and 2% by mass inclusive, and most preferably between 0.05% and 1% by mass inclusive. When the mean molecular weight of hydroxyethyl cellulose or polyvinyl alcohol is too low, or when the content of hydroxyethyl cellulose or polyvinyl alcohol is too low, there is a risk that the polishing composition does not have a high haze-improving action or that the surface wetting properties of a wafer after polishing are not sufficiently improved. When the mean molecular weight of hydroxyethyl cellulose or polyvinyl alcohol is too high, or when the content of hydroxyethyl cellulose or polyvinyl alcohol is too high, there is a risk that the viscosity of the polishing composition excessively increasing.

The aforementioned water contained in the polishing composition plays a role as a medium in which components other than water contained in the polishing composition are dispersed or dissolved. Water may be pure water, extra pure water, distilled water, ion exchanged water, or water obtained by subjecting ion exchanged water to filtration. It is desired that the water contain as little impurities as possible.

The polishing composition is prepared by mixing polyether represented by chemical formula 1, silicon dioxide, a basic compound, either hydroxyethyl cellulose or polyvinyl alcohol, and water. In order to mix the above components, a wing stirrer or ultrasonic dispersing machine may be used. When the components are mixed, the order of adding each component is not particularly limited. All the components may also be added simultaneously.

The present embodiment provides the following advantages.

The polishing composition according to the present embodiment comprises both silicon dioxide having an action to mechanically polish an object, and a basic compound having an action to chemically polish the object. Accordingly, the polishing composition has high ability to polish an object, and especially, a semiconductor substrate such as a silicon wafer. In other words, the polishing composition has the ability to rapidly polish an object, and especially, a semiconductor substrate such as a silicon wafer.

The polishing composition according to the present embodiment comprises hydroxyethyl cellulose or polyvinyl alcohol. Accordingly, the level of haze observed on the surface of a wafer after polishing is reduced. Further, by improving the surface wetting properties of the wafer, the number of LPDs observed on the wafer surface after polishing is also reduced.

The polishing composition according to the present embodiment comprises polyether represented by chemical formula 1. In this polyether, the action of oxyethylene groups is stronger than that of oxypropylene groups. Accordingly, the polishing composition containing this polyether improves COPs and haze by the action of oxyethylene groups and oxypropylene groups, with no significant decrease in a polishing rate.

When the sum of a and c in chemical formula 1 is between 2 and 1,000 inclusive, when the value b in the same formula is between 2 and 200 inclusive, or when the ratio of the total mass of oxyethylene groups to the total mass of oxypropylene groups is between 30/70 and 95/5 inclusive in polyether represented by chemical formula 1, the polishing composition further improves COPs and haze.

It should be apparent to those skilled in the art that the present invention may be embodied in many other specific forms without departing from the spirit of scope of the invention. Particularly, it should be understood that the invention may be embodied in the following forms.

Polyether represented by chemical formula 1 contained in the polishing composition according to the above described embodiment may be a mixture consisting of a plurality of polyethers wherein, in chemical formula 1, the sum of a and c or the value b is different. Otherwise, it may also be a mixture consisting of a plurality of polyethers wherein the ratio of the total mass of oxyethylene groups to the total mass of oxypropylene groups is different.

The polishing composition according to the above described embodiment may comprise both hydroxyethyl cellulose and polyvinyl alcohol.

The polishing composition according to the above described embodiment may further comprise a chelating agent, a surfactant, an antiseptic, etc.

The polishing composition according to the above described embodiment may be prepared by diluting a stock solution with water. The amount of water added to a stock solution for dilution is preferably 1 to 50 times the volume of the stock solution, more preferably 1 to 40 times the volume thereof, and most preferably 1 to 25 times the volume thereof. The use of a stock solution that is not concentrated so much leads to a high cost during storage and transport. On the other hand, a stock solution that is excessively concentrated is highly likely to gelatinize.

The present invention will be further specifically described in the following examples and comparative examples.

In Examples 1 to 11, polyether represented by chemical formula 1, silicon dioxide, a basic compound, a water-soluble polymer, and water were mixed, so as to prepare a stock solution of a polishing composition. Details regarding polyether, a basic compound, and a water-soluble polymer contained in each stock solution according to Examples 1 to 11 are shown in Table 2. In Comparative examples 1 to 8, silicon dioxide, a basic compound, and water were mixed, and thereafter, polyether represented by chemical formula 1, a compound used instead of the polyether represented by chemical formula 1, or a water-soluble polymer was further added thereto as necessary, so as to prepare a stock solution of a polishing composition. Details regarding polyether, a compound used instead of the polyether, a basic compound, and a water-soluble polymer contained in each stock solution according to Comparative examples 1 to 8 are also shown in Table 2.

Silicon dioxide contained in each stock solution according to Examples 1 to 11 and Comparative examples 1 to 8 was colloidal silica. The content of the colloidal silica in each stock solution was 10% by mass. When a 20% by mass colloidal silica aqueous solution was prepared using this colloidal silica, the total amount of iron, nickel, copper, chrome, zinc, and calcium contained in the aqueous solution was 20 ppb or less. In addition, the mean particle size $D_{SA}$ of the colloidal silica measured with a "FlowSorb II 2300" manufactured by Micromeritics was 35 nm, and the mean particle size $D_{N4}$ measured with a "N4 Plus Submicron Particle Sizer" manufactured by Beckman Coulter, Inc. was 70 nm.

In the column in Table 2 entitled "compound used instead of polyether represented by chemical formula 1", the term "PEO" represents polyethylene oxide having a viscosity-average molecular weight of 300,000, and the term "PEP" represents polyether represented by chemical formula 2, wherein the sum of d and f is 30 and the value e is 5. In the "basic compound" column in Table 2, the term "ammonia" represents an aqueous solution containing 29% by mass ammonia, and the term "TMAH" represents tetramethylammonium hydroxide. In the "water-soluble polymer" column in Table 2, the term "HEC" represents hydroxyethyl cellulose having a viscosity-average molecular weight of 1,000,000, and the term "PVA" represents polyvinyl alcohol having a number-average molecular weight of 105,000 and a saponification degree of 98%.

Each stock solution according to Examples 1 to 11 and Comparative examples 1 to 8 was diluted with extra pure water, so that the final volume could become 20 times the initial volume, thereby preparing a polishing composition. Using the thus obtained polishing composition according to each of Examples 1 to 11 and Comparative examples 1 to 8,

TABLE 2

| | Polyether represented by chemical formula 1 | | | | Compound used instead of polyether represented by chemical formula 1 (content [mass %]) | Basic compound (content [mass %]) | Water-soluble polymer (content [mass %]) |
|---|---|---|---|---|---|---|---|
| | Sum of a and c | Value b | EO:PO | Content [mass %] | | | |
| Ex. 1 | 164 | 31 | 80:20 | 0.01% | — | Ammonia (1%) | HEC (0.3%) |
| Ex. 2 | 164 | 31 | 80:20 | 0.05% | — | Ammonia (1%) | HEC (0.3%) |
| Ex. 3 | 164 | 31 | 80:20 | 0.01% | — | Ammonia (1%) | HEC (0.3%) |
| Ex. 4 | 500 | 95 | 80;20 | 0.01% | — | Ammonia (1%) | HEC (0.3%) |
| Ex. 5 | 500 | 95 | 80:20 | 0.05% | — | Ammonia (1%) | HEC (0.3%) |
| Ex. 6 | 27 | 31 | 40:60 | 0.01% | — | Ammonia (1%) | HEC (0.3%) |
| Ex. 7 | 27 | 31 | 40:60 | 0.05% | — | Ammonia (1%) | HEC (0.3%) |
| Ex. 8 | 164 | 31 | 80:20 | 0.05% | — | Ammonia (1%) | HEC/PVA (0.3%/0.2%) |
| Ex. 9 | 164 | 31 | 80:20 | 0.05% | — | Potassium Hydroxide (1%) | HEC (0.3%) |
| Ex. 10 | 164 | 31 | 80:20 | 0.05% | — | TMAH (1%) | HEC (0.3%) |
| Ex. 11 | 164 | 31 | 80:20 | 0.05% | — | Piperazine Anhydride (1%) | HEC (0.3%) |
| C. Ex. 1 | — | — | — | — | — | Ammonia (1%) | HEC (0.3%) |
| C. Ex. 2 | — | — | — | — | PEP (0.01%) | Ammonia (1%) | HEC (0.3%) |
| C. Ex. 3 | — | — | — | — | PEP (0.05%) | Ammonia (1%) | HEC (0.3%) |
| C. Ex. 4 | — | — | — | — | — | Ammonia (1%) | HEC/PVA (0.3%/0.2%) |
| C. Ex. 5 | — | — | — | — | PEO (0.05%) | Ammonia (1%) | HEC (0.3%) |
| C. Ex. 6 | — | — | — | — | PEP (0.01%) | Potassium Hydroxide (1%) | — |
| C. Ex. 7 | 164 | 31 | 80:20 | 0.05% | PEP (0.01%) | Ammonia (1%) | HEC (0:3%) |
| C. Ex. 8 | 164 | 31 | 80:20 | 0.05% | PEP (0.05%) | Ammonia (1%) | HEC (0.3%) | the surface of a silicon wafer was polished under the following polishing conditions.

<Polishing Conditions>

Polishing instrument: A single-sided polisher "SPM-15" manufactured by Fujikoshi Machinery Corp., which are equipped with four wafer holders capable of holding four slices of wafers per holder.

Object to be polished: 16 slices of 6-inch silicon wafers (p-type, crystal orientation<100>, resistivity of less than 0.01 Ω/cm, or from 0.1 Ω/cm or more to less than 100 Ω/cm), which were produced by subjecting to an edge-polishing step and then pre-polishing to a thickness of 12 μm using a polishing composition "GLANZOX-1102" manufactured by Fujimi Incorporated.

Polishing load: 9.4 kPa.

Rate of rotation of surface plate: 30 rpm.

Rate of rotation of wafer holder: 30 rpm.

Polishing pad: "Surfin 000FM" manufactured by Fujimi Incorporated.

Rate of supply of polishing composition: 500 ml/min (throwaway).

Polishing time: 30 minutes.

Temperature of polishing composition: 20° C.

After polishing, a silicon wafer having a resistivity of less than 0.01 Ω/cm was subjected to scrub washing with pure water for 10 seconds. Thereafter, it was further washed with an SC-1 solution containing a 29% by mass ammonia aqueous solution, a 31% by mass hydrogen peroxide aqueous solution, and pure water at a volume ratio of 1:1:15. Thereafter, the level of haze existing on the surface of the silicon wafer was measured using an "AMS-AWIS3110" manufactured by ADE. The measurement results obtained are shown in the "haze" column in Table 3.

After polishing, a silicon wafer having a resistivity from 0.1 Ω/cm or more to less than 100 Ω/cm was subjected to scrub washing with pure water for 10 seconds, and then washed with an SC-1 solution. Thereafter, the number of COPs existing on the surface of the silicon wafer was measured using the same above "AMS-AWIS3110" manufactured by ADE. The measurement results obtained are shown in the "COP" column in Table 3. Also, using the "AMS-AWIS3110," the number of particles with a size of 0.08 μm or greater existing on the surface of the silicon water after washing was measured. When the number of measured particles was less than 20, the wafer was evaluated as 'excellent,' when the number was from 20 to 50, it was evaluated as 'good,' and when the number was 50 or more, it was evaluated as 'poor.' Thus, each wafer was evaluated in 3 stages. The evaluation results are shown in the "particles" column in Table 3.

A silicon wafer having a resistivity from 0.1 Ω/cm or more to less than 100 Ω/cm was polished under the above described polishing conditions. The thickness of the wafer was measured before and after the polishing. The difference in the thicknesses measured before and after polishing was divided by the polishing time, so as to calculate a polishing rate. The calculated polishing rate is shown in the "polishing rate" column in Table 3.

TABLE 3

|  | Haze (ppm) | COP (number) | Particles | Polishing rate [nm/min] |
| --- | --- | --- | --- | --- |
| Ex. 1 | 0.07 | 500 | Excellent | 14.0 |
| Ex. 2 | 0.05 | 510 | Excellent | 5.9 |
| Ex. 3 | 0.05 | 590 | Excellent | 3.2 |
| Ex. 4 | 0.07 | 530 | Excellent | 6.8 |
| Ex. 5 | 0.05 | 580 | Excellent | 3.6 |
| Ex. 6 | 0.06 | 520 | Excellent | 5.9 |
| Ex. 7 | 0.09 | 590 | Excellent | 3.1 |
| Ex. 8 | 0.05 | 570 | Good | 4.8 |
| Ex. 9 | 0.07 | 570 | Excellent | 3.1 |
| Ex. 10 | 0.07 | 550 | Excellent | 3.5 |
| Ex. 11 | 0.07 | 590 | Excellent | 3.7 |
| C. Ex. 1 | 0.10 | 500 | Excellent | 15.0 |
| C. Ex. 2 | 0.08 | 800 | Good | 2.0 |
| C. Ex. 3 | 0.15 | 880 | Good | 0.0 |
| C. Ex. 4 | 0.10 | 520 | Excellent | 6.8 |
| C. Ex. 5 | 0.04 | 710 | Excellent | 6.2 |
| C. Ex. 6 | 0.21 | 870 | Poor | 3.1 |
| C. Ex. 7 | 0.17 | 1270 | Good | 0.5 |
| C. Ex. 8 | 0.18 | 1550 | Good | 0.0 |

As shown in Table 3, the wafer polished with the polishing composition according to each of Examples 1 to 11 generally has a low level of haze and a few number of COPs, when compared with the wafer polished with the polishing composition according to each of Comparative examples 1 to 8. Moreover, when compared with the polishing composition according to each of Comparative examples 1 to 8, the polishing composition according to each of Examples 1 to 11 generally has a high polishing rate. These results suggest that the polishing composition according to each of Examples 1 to 11 is useful for polishing a silicon wafer. In addition, with regard to all the polishing compositions according to Examples 1 to 11, the evaluation result regarding particles was 'excellent' or 'good.' This result suggests that the polishing composition according to each of Examples 1 to 11 contributes also to a reduction in the number of LPDs observed on the surface of a silicon wafer after polishing.

Figure 3A:
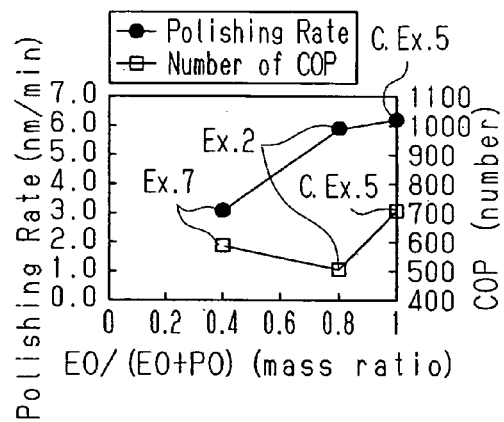
FIG. 3(a) is a graph showing the relationship between the ratio of the total mass of oxyethylene groups to the sum of the total mass of oxypropylene groups and the total mass of oxyethylene groups in polyether represented by chemical formula 1 contained in a polishing composition and the number of COPs, and the relationship between the ratio and a polishing rate.
Figure 3B:
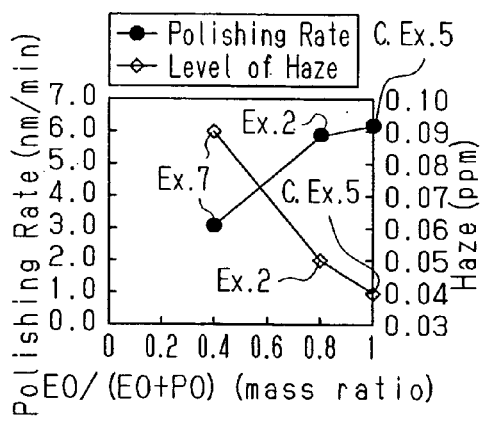
FIG. 3(b) is a graph showing the relationship between the ratio of the total mass of oxyethylene groups to the sum of the total mass of oxypropylene groups and the total mass of oxyethylene groups in polyether represented by chemical formula 1 contained in a polishing composition and the level of haze, and the relationship between the ratio and a polishing rate.

FIG. 3(a) is a graph showing the relationship between the ratio of the total mass of oxyethylene groups to the sum of the total mass of oxypropylene groups and the total mass of oxyethylene groups in polyether represented by chemical formula 1 contained in a polishing composition and the number of COPs, and the relationship between the ratio and a polishing rate. FIG. 3(b) is a graph showing the relationship between the ratio of the total mass of oxyethylene groups to the sum of the total mass of oxypropylene groups and the total mass of oxyethylene groups in polyether represented by chemical formula 1 contained in a polishing composition and the level of haze, and the relationship between the ratio and a polishing rate. The value b in chemical formula 1 representing polyether is 31, and the content of polyether in the polishing composition is 0.05% by mass. As shown in FIGS. 3(a) and 3(b), as the ratio of the total mass of oxyethylene groups to the sum of the total mass of oxypropylene groups and the total mass of oxyethylene groups increases, the polishing rate is improved, and haze and COPs are more strongly improved. However, when the ratio of the total mass of oxyethylene groups to the sum of the total mass of oxypropylene groups and the total mass of oxyethylene groups is 1, that is, when polyether is polyethylene oxide (Comparative example 5), the number of COPs increases.

Figure 4A:
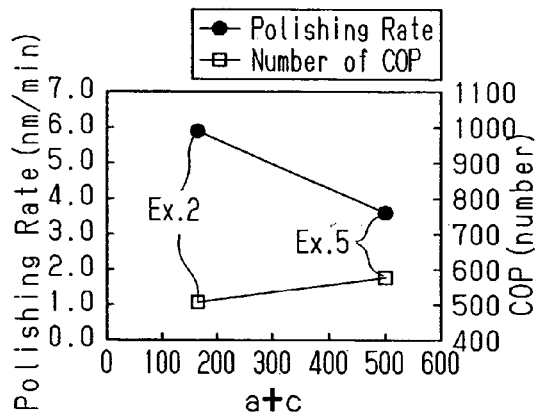
FIG. 4(a) is a graph showing the relationship between the sum of a and c in chemical formula 1 representing polyether contained in a polishing composition and the number of COPs, and the relationship between the sum and a polishing rate.
Figure 4B:
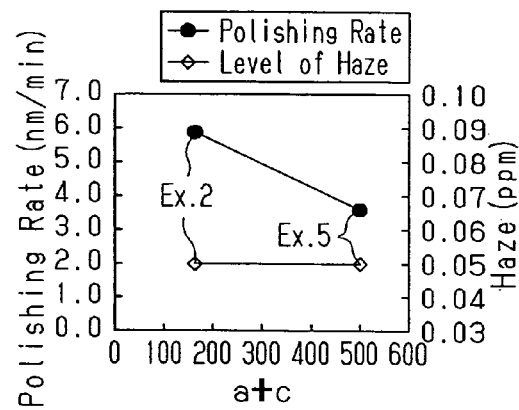
FIG. 4(b) is a graph showing the relationship between the sum of a and c in chemical formula 1 representing polyether contained in a polishing composition and the level of haze, and the relationship between the sum and a polishing rate.

FIG. 4(a) is a graph showing the relationship between the sum of a and c in chemical formula 1 representing polyether contained in a polishing composition and the number of COPs, and the relationship between the sum and a polishing rate. FIG. 4(b) is a graph showing the relationship between the sum of a and c in chemical formula 1 representing polyether contained in a polishing composition and the level of haze, and the relationship between the sum and a polishing rate. The ratio of the total mass of oxyethylene groups to the total mass of oxypropylene groups in polyether is 80/20, and the content of polyether in the polishing composition is 0.05% by mass. As shown in FIGS. 4(a) and 4(b), as the sum of a and c decreases, the polishing rate is improved, and COPs are more strongly improved. However, the level of haze is not influenced by changes in the sum of a and c in chemical formula 1.

Figure 5A:
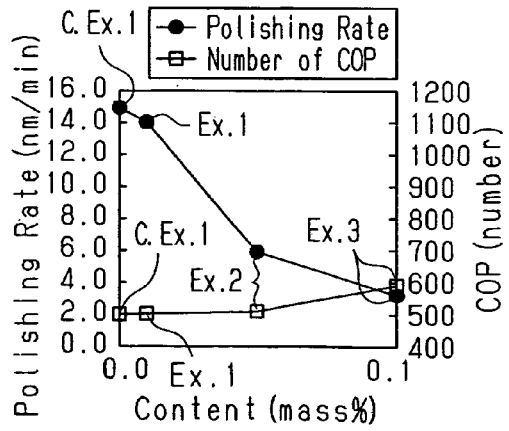
FIG. 5(a) is a graph showing the relationship between the content of polyether represented by chemical formula 1 in a polishing composition and the number of COPs, and the relationship between the content and a polishing rate.
Figure 5B:
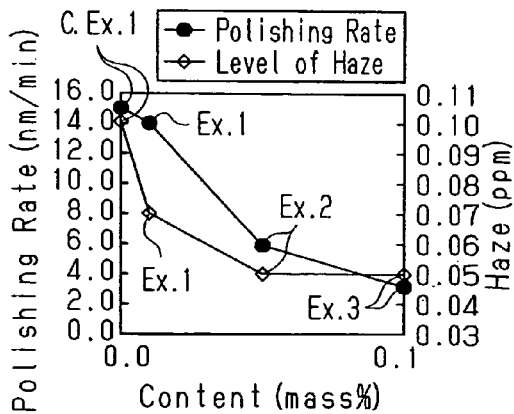
FIG. 5(b) is a graph showing the relationship between the content of polyether represented by chemical formula 1 in a polishing composition and the level of haze, and the relationship between the content and a polishing rate.

FIG. 5(a) is a graph showing the relationship between the content of polyether represented by chemical formula 1 in a polishing composition and the number of COPs, and the relationship between the content and a polishing rate. FIG. 5(b) is a graph showing the relationship between the content of polyether represented by chemical formula 1 in a polishing composition and the level of haze, and the relationship between the content and a polishing rate. The sum of a and c in chemical formula 1 representing polyether is 164. The ratio of the total mass of oxyethylene groups to the total mass of oxypropylene groups in polyether is 80/20. As shown in FIGS. 5(a) and 5(b), as the content of polyether in the polishing composition increases, the polishing rate decreases, but haze is strongly improved.

The invention claimed is:

1. A polishing composition comprising:
    a block polyether represented by the chemical formula $HO-(EO)_a-(PO)_b-(EO)_c-H$, wherein EO represents an oxyethylene group, PO represents an oxypropylene group, each of a and c represents the polymerization degree; of ethylene oxide, b represents the polymerization degree of propylene oxide, each of a, b, and c is an integer of 1 or greater, and the ratio of the total mass of oxyethylene groups to the total mass of oxypropylene groups is between 70/30 and 90/10 inclusive in the polyether;
    silicon dioxide;
    a basic compound;
    at least either one of hydroxyethyl cellulose and polyvinyl alcohol; and
    water.

2. The polishing composition according to claim 1, wherein the sum of a and c in the chemical formula is between 2 and 1,000 inclusive.

3. The polishing composition according to claim 1, wherein b in the chemical formula is between 2 and 200 inclusive.

4. The polishing composition according to claim 1, which does not comprise a block polyether represented by the chemical formula $HO-(PO)_d-(EO)_e-(PO)_f H$, wherein PO represents an oxypropylene group, EO represents an oxyethylene group, each of d and f represents the polymerization degree of propylene oxide, e represents the polymerization degree of ethylene oxide, and each of d, e, and f is an integer of 1 or greater.

5. A method for polishing a semiconductor substrate, the method comprising:
    preparing a polishing composition of claim 1; and
    using the polishing composition to polish the substrate.

6. A polishing composition consisting of:
    a block polyether represented by the chemical formula $HO-(EO)_a-(PO)_b-(EO)_c H$, wherein EO represents an oxyethylene group, PO represents an oxypropylene group, each of a and c represents the polymerization degree of ethylene oxide, b represents the polymerization degree of propylene oxide, each of a, b, and c is an integer of 1 or greater, and the ratio of the total mass of oxyethylene groups to the total mass of oxypropylene groups is between 70/30 and 90/10 inclusive in the polyether;
    silicon dioxide;
    a basic compound;
    at least either one of hydroxyethyl cellulose and polyvinyl alcohol; and
    water.

7. The polishing composition according to claim 6, wherein the sum of a and c in the chemical formula is between 2 and 1,000 inclusive.

8. The polishing composition according to claim 6, wherein b in the chemical formula is between 2 and 200 inclusive.

9. A method for polishing a semiconductor substrate, the method comprising:
    preparing a polishing composition of claim 6; and
    using the polishing composition to polish the substrate.

10. The polishing composition according to claim 1, wherein the content of the polyether in the polishing composition is between 0.02% and 0.1% by mass inclusive.

11. The polishing composition according to claim 6, wherein the content of the polyether in the polishing composition is between 0.02% and 0.1% by mass inclusive.

* * * * *